(12) United States Patent
Tsai et al.

(10) Patent No.: US 6,692,878 B2
(45) Date of Patent: Feb. 17, 2004

(54) PHOTOMASK FRAME MODIFICATION TO ELIMINATE PROCESS INDUCED CRITICAL DIMENSION CONTROL VARIATION

(75) Inventors: Wilman Tsai, Saratoga, CA (US); Marilyn Kamna, San Jose, CA (US); Frederick Chen, San Jose, CA (US); Jeff Farnsworth, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/222,655

(22) Filed: Aug. 15, 2002

(65) Prior Publication Data

US 2003/0008221 A1 Jan. 9, 2003

Related U.S. Application Data

(63) Continuation of application No. 09/411,729, filed on Oct. 1, 1999, now Pat. No. 6,485,869.

(51) Int. Cl.[7] .............................. G03F 9/00; G03B 27/00
(52) U.S. Cl. .............................................. 430/5; 355/18
(58) Field of Search ................................ 355/18; 430/5, 430/312, 313, 314, 394; 216/67, 65, 66; 438/9

(56) References Cited

U.S. PATENT DOCUMENTS

| | | | | |
|---|---|---|---|---|
| 4,797,334 A | * | 1/1989 | Glendinning | 430/5 |
| 5,369,051 A | * | 11/1994 | Rao et al. | 437/69 |
| 5,723,234 A | | 3/1998 | Yokoyama et al. | |
| 5,728,507 A | | 3/1998 | Rhoades et al. | |
| 6,027,865 A | | 2/2000 | Andoh | |
| 6,210,843 B1 | * | 4/2001 | Chen et al. | 430/5 |
| 6,485,869 B2 | * | 11/2002 | Tsai et al. | 430/5 |

OTHER PUBLICATIONS

Gwyn, C.W., "Extreme ultraviolet lithography", J. Vac. Sci. Technol. B16 p. 3142 Nov./Dec. 1998.

Stanton, S.T., "Critical dimension control at stitched subbied boundaries in a high–throughput SCALPEL system", J. Vac. Sci. Technol. B16 p. 3197 Nov./Dec. 1998.

Rangelow, I.W., "p–n Junction–based wafer flow process for stencil mask fabrication", J. Vac. Sci. Technol. B16 p. 3592 Nov./Dec. 1998.

Silverman, J.P., "X–ray lithography", J.Vac. Sci. Tchnol. B16 p. 3137 Nov./Dec. 1998.

Berger, S., Scalpel (Scattering with Angular Limitaion in Projection Electron Beam Lithography), Appl. Phys. Lett. 57 p. 153 1990.

Cha, B., "Evaluation of process capability for 50 keV with a rectangular shaped beam using computer simulation", SPIE vol. 3236, p. 34 1997.

Segawa, T., "Performance of positive tone chemically amplified resist for next generation photomask fabrication", Proc. SPIE vol. 3236, p. 82 1997.

(List continued on next page.)

*Primary Examiner*—Mark F. Huff
*Assistant Examiner*—Saleha Mohamedulla
(74) *Attorney, Agent, or Firm*—Blakely, Sokoloff, Taylor & Zafman LLP (57) ABSTRACT

An apparatus comprising a mask having an active device area and a moat. The moat substantially surrounds the mask active device area and has a width greater than a plasma specie diffusional length. A method comprising depositing a layer of resist on a mask substrate having transparent and opaque layers; and exposing the resist layer to radiation. The radiation is patterned to produce features within an active device area. The radiation is also patterned to produce a moat substantially surrounding the active device area having a width greater than a plasma specie diffusional length.

10 Claims, 9 Drawing Sheets

OTHER PUBLICATIONS

Aoyama, S., "Advanced process worth magmetically enhanced RIE for fase shift mask abrication", Proc. SPIE vol. 1927, p. 715 1993.

Abboud, F., Further Advances in Electron–Beam pattern Generation Technology for 180 Masks (cont.) SPIE vol. 3412 Apr. 1998.

Gabriel, C.,J. Vac. Sci Technol. A15, p. 697 1997.

Tsai, W., "Plasma Etching of AZ5206/Cr and ZEP7000/CR for 0.18–0.25 m generation advanced mask fabrication", Photomask Japan 1997.

Gottscho, R., J. Vac. Sci. Technol. B10, p. 2133 1992.

Coleman, T., "Plasma Etching of Chromium Films in the Fabrication of Photomasks", Proc. 5 SPIE vol. 2621, p. 62 1995.

* cited by examiner

PHOTOMASK FRAME MODIFICATION TO ELIMINATE PROCESS INDUCED CRITICAL DIMENSION CONTROL VARIATION

This is a continuation of U.S. patent application Ser. No. 09/411,729, filed on Oct. 1, 1999, now U.S. Pat. No. 6,485,869, and entitled Photomask Frame Modification To Eliminate Process Induced Critical Dimension Control Variation.

FIELD OF INVENTION

The field of the invention relates to semiconductor manufacturing lithography technology and more specifically to mask features designed to improve critical dimension control.

BACKGROUND OF THE INVENTION

The various conducting lines and other features found within a semiconductor chip are created by lithographic means. That is, light is passed through a mask and focused onto a semiconductor wafer surface coated with a resist. The mask contains opaque and transparent areas such that, for negative resists, opaque regions correspond to the desired features formed on the semiconductor wafer surface (such as transistor gates or metal interconnection lines). Alternatively, if a positive resist is used, the transparent regions correspond to the desired features.

The critical dimension of a semiconductor process is used to refer to one of the process's smallest achievable dimensions. For example, the smallest feature size formed in a direction parallel to the surface of the wafer. Currently, a horizontal critical dimension of leading edge semiconductor devices is 0.13–0.25 micron ($\mu$m). As the projection optics of today's leading edge exposure tools reduce the optical image from the mask by approximately 4:1, the critical dimension of today's leading edge masks is approximately 0.52–1.0 $\mu$m (4×0.13–0.25=0.52–1.0).

Figure 1:
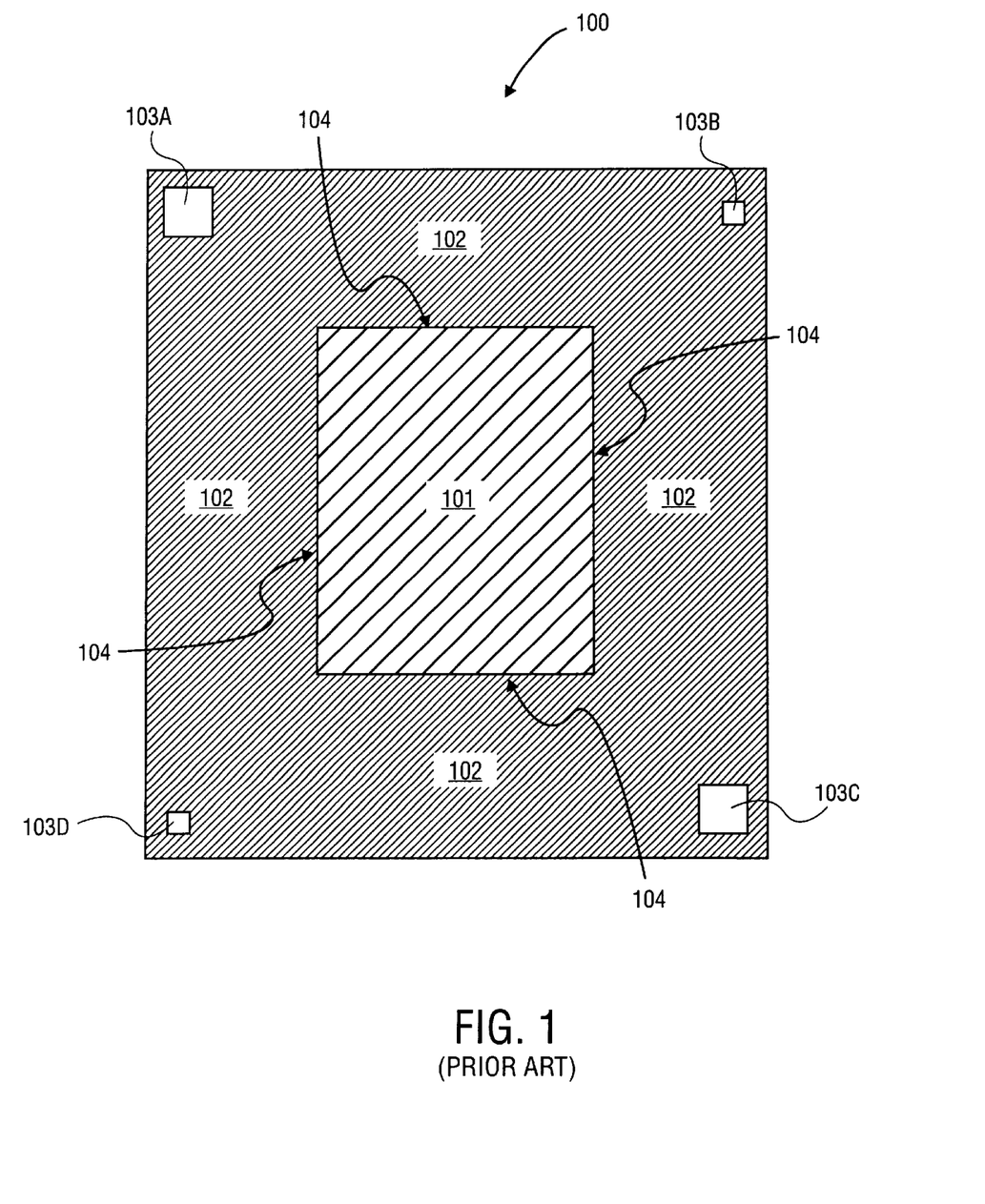
FIG. 1 shows a typical mask.

A problem with masks is the variation of the mask's critical dimension at the outer edge of a die pattern. That is, as shown in FIG. 1, a mask 100 typically has a central area 101 having the various features formed on the semiconductor die. This central area 101 is also referred to as a die pattern, an active area, an active device area or the like. The area outside the active device area, referred to as the inactive area 102, is largely unused space. For the most part, the most meaningful features on the mask are those that help create the features on the silicon chip (which are within the active area 101). Typically, alignment features 103a–d (used for mask alignment purposes) are the main features used within the inactive area 102.

Figure 2A:
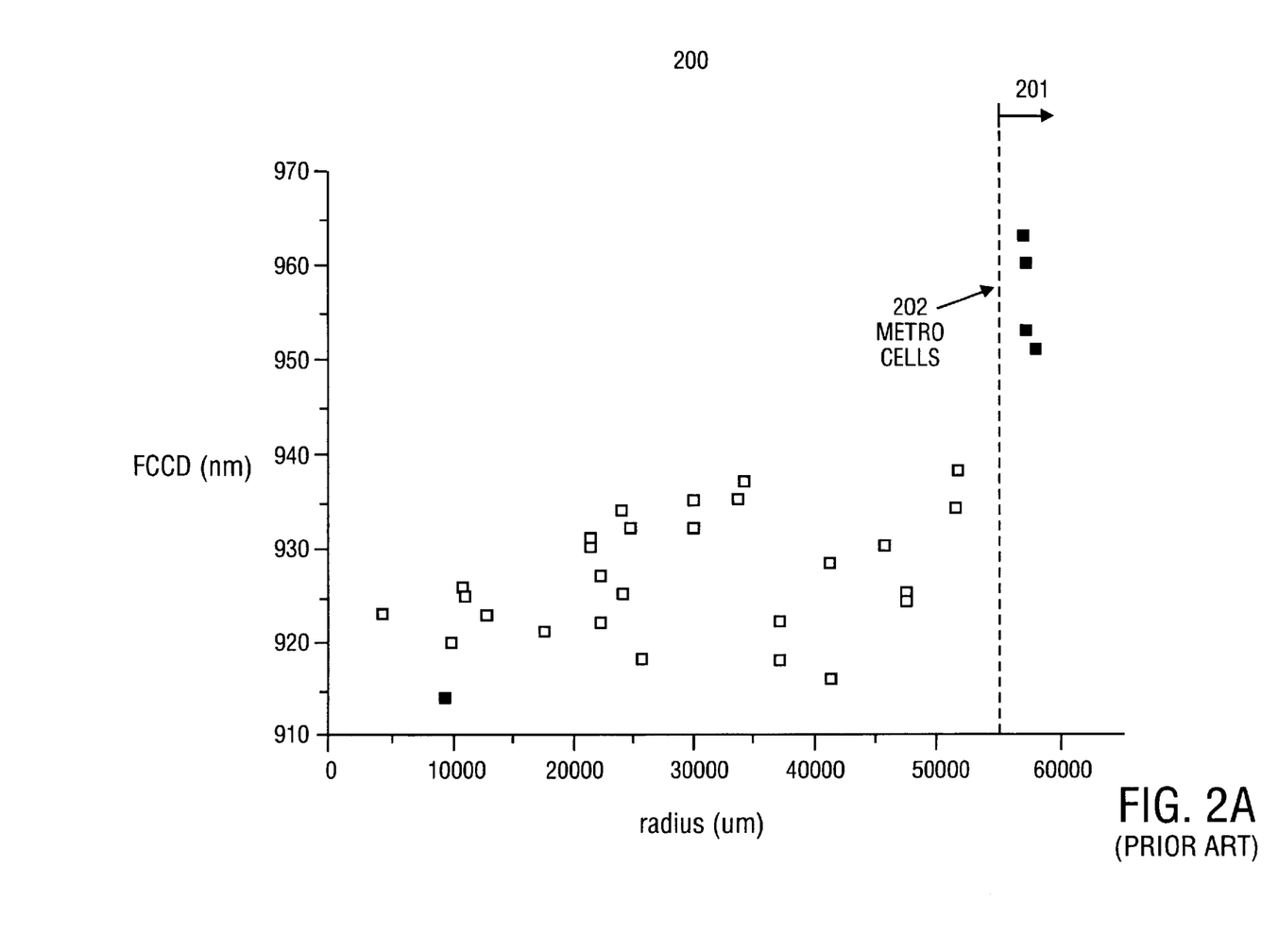
FIG. 2a shows critical dimension versus mask radius without moat correction.

It has been observed that the smallest achievable feature size (i.e., a critical dimension) on the mask increases at the outer edge 104 of the active area 101. For example, FIG. 2a shows the variation 200 of a mask's Final Check Critical Dimension (FCCD) with the mask's radius. Toward the outer edge of the active area 201 (approximately 55000 $\mu$m from the mask's center in this example) there is a sharp increase in the critical dimension range from approximately 0.910–0.940 $\mu$m to 0.950–0.965 $\mu$m.

Figure 2B:
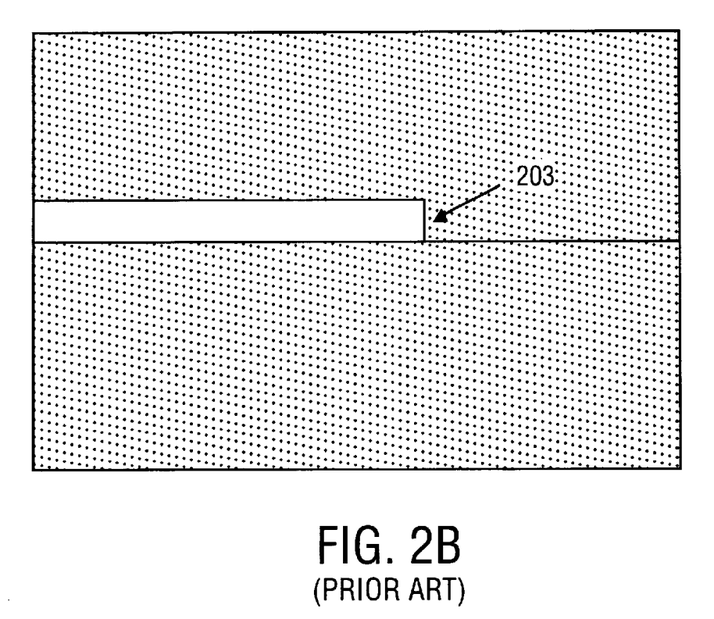
FIG. 2b shows an inner feature edge.
Figure 2C:
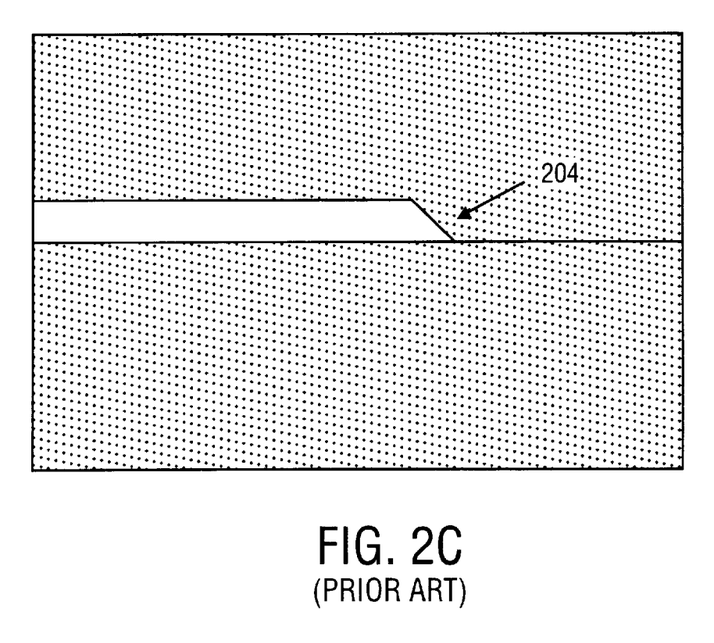
FIG. 2c shows a metro cell edge.

This lack of control usually affects features commonly referred to as metro cells. Metro cells 202 are a set of features used for the alignment of a lithographic stepper. As metro cells are usually placed near the outer edge of the active area 104 (referring briefly back to FIG. 1), metro cells 202 tend to be more distorted than other features. Thus FIG. 2a shows the critical dimension of the metro cells 202 within an undesired 0.950–0.965 $\mu$m critical dimension range. FIG. 2b shows an SEM photograph of an inner feature edge 203 that is within a mask's active device area (101 of FIG. 1) and sufficiently far from the active device area edge (104 of FIG. 1). FIG. 2c shows an SEM photograph of a metro cell edge 204 from the same mask as that shown in FIG. 2b. The loss of critical dimension control is seen by comparison of FIG. 2b with FIG. 2c. The metro cell's edge 204, being substantially more sloped than the inner feature edge 203, results in a larger metro cell 202 critical dimension.

The inability to keep the metro cell's critical dimension within a normal range (e.g., 0.910–0.940 $\mu$m) results in manufacturing inefficiencies. Specifically, the mask has to be manually or custom exposed in order to compensate for the distortion to the metro cell. This custom fitting procedure slows down the manufacturing process resulting in added expense (through wasted time). If the metro cell critical dimension could be manufactured within the same range as the features within the active area, the custom fitting procedure may be eliminated resulting in substantial savings to current manufacturing costs.

SUMMARY OF THE INVENTION

An apparatus is described comprising a mask having an active device area and a moat. The moat substantially surrounds the mask active device area and has a width greater than a plasma specie diffusional length. A method is described comprising depositing a layer of resist on a mask substrate having transparent and opaque layers; and then exposing the resist layer to radiation. The radiation is patterned to produce features within an active device area. The radiation is also patterned to produce a moat substantially surrounding the active device area having a width greater than a plasma specie diffusional length.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

An apparatus is described of a mask having an active device area and a moat. The moat substantially surrounds the mask active device area and has a width greater than a plasma specie diffusional length. A method is described involving depositing a layer of resist on a mask substrate having transparent and opaque layers; and then exposing the resist layer to radiation. The radiation is patterned to produce features within an active device area. The radiation is also patterned to produce a moat substantially surrounding the active device area having a width greater than a plasma specie diffusional length.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

Figure 3A:
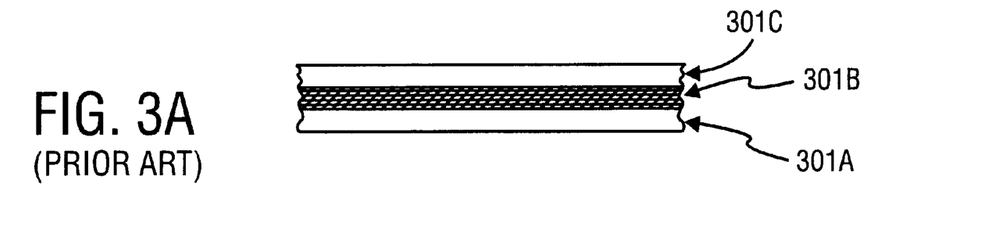
FIG. 3a shows material used to form a mask.

In order to address the critical dimension variation at the outer regions of the active area the process of mask making should be understood and some theories should be discussed as to why the variation occurs. FIG. 3 shows the general process of manufacturing a mask. FIG. 3a shows the material 301 typically used to form a mask. The material 301 is typically a three level multilayer structure, however, other structures are possible. The first layer 301a is a transparent material usually comprised of quartz. However, other materials such as fused silica, fluorinated fused silica and $CaF_2$ may be used as well.

The second layer 301b is an opaque material such as chrome (Cr) or other metallic. Other materials may be used for the opaque material such as CrF, or silicon containing materials such as MoSi, NiSi and TiSi. Dielectric absorbing materials may also be used. Also, an anti reflective coating (ARC) 301c may be placed atop the opaque material 301b. The ARC thickness is typically a quarter wavelength of the exposure radiation used during semiconductor device processing. For UV or deep UV applications (having wavelengths from approximately 1E-7 to 1E-8 meters) the thickness of the ARC typically ranges from 300 to 25 angstroms (A) The ARC is used to reduce optical flaring. The ARC is typically comprised of $CrO_xN_y$. However, materials such as CrO, SiN and TiN may also be used.

The CD control approach described in this disclosure is also applicable to manufacturing masks for all the Next Generation Lithography (NGL) techniques, including extreme ultraviolet lithography (EUV), X-ray lithography, electron-beam projection and ion projection lithography. The discussion herein may also be used for phase shifting masks. The appropriate substitution for the substrate and opaque layers may be made by those skilled in the art.

Figure 3B:
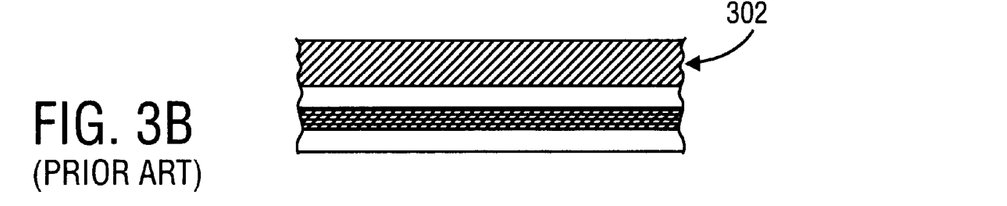
FIG. 3b shows the material of FIG. 3a covered with resist.

The general idea is that transparent regions are created by etching away the opaque material 301b (along with the ARC in those embodiments employing an ARC) at specific regions where transparent areas are desired. Similar to semiconductor device manufacturing, mask features are formed by a lithographic process. Thus, as shown in FIG. 3b, a layer of resist 302 is first formed over the surface. The resist material may be a polymeric material such as poly (methyl methacrylate) (PMMA), poly(butene-1-sulfone) (PBS) or the ZEP family of chlorinated polymers. However, other materials such as Chemical Amplified Resists (CAR), among others, may be used as well.

Figure 3C:
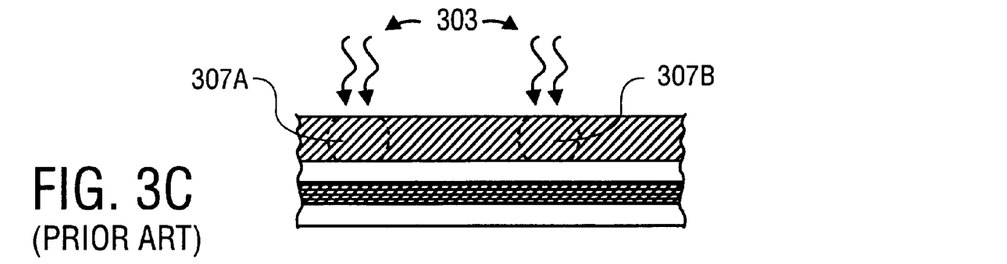
FIG. 3c shows the resist of FIG. 3b exposed to radiation.

After the resist layer 302 is formed, it is exposed to radiation 303 such as an electron beam (E-beam) including ebeam projection techniques, ion beam or laser beam as shown in FIG. 3c. The radiation 303 source is typically capable of directly writing the desired features in a custom fashion into the resist layer 302. That is, different semiconductor chips typically have unique mask sets having their own unique patterns and features.

For a positive resist 302 (as shown in FIG. 3), typically, the radiation source 303 causes bond breaking between polymer chains within the resist layer 302. This makes resist regions exposed to the radiation source 303 (e.g., resist regions 307a,b) easily removed by a subsequent (typically) wet develop process. Alternatively, for negative resists, the radiation source 303 causes bond formation between polymer chains within the resist layer making the non-exposed regions easily removed by a subsequent (typically) wet develop process. Thus for positive resists 302 "written to" regions 307a,b are removed after the wet develop process; while, for negative resists, written to regions 307a,b remain after the wet develop process.

Figure 3D:
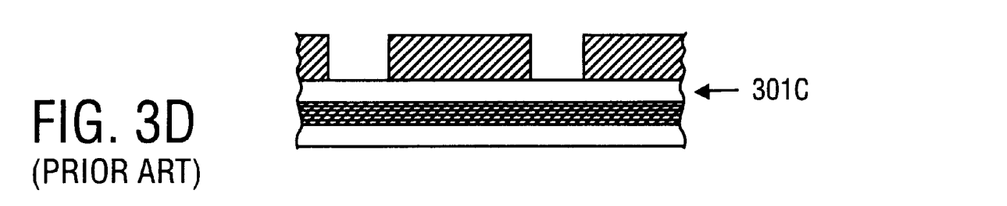
FIG. 3d shows the resist of FIG. 3c after an etch.

For positive resists, after exposing the entire mask surface to a (typically) wet develop process, the resist is removed at the written to regions (e.g., regions 307a,b) which ultimately exposes the underlying mask material 301c as shown in FIG. 3d. If a mask without an ARC layer 301c is used, in regard to the example of FIG. 3, opaque layer 301b would be exposed.

Figure 3E:
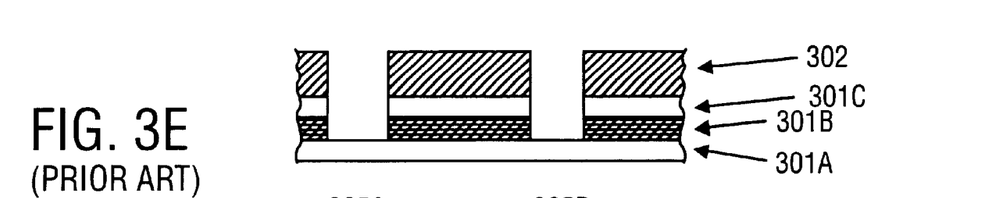
FIG. 3e shows the material of FIG. 3a after an etch.

A subsequent dry etch (i.e., a plasma based etch such as Reactive Ion Etch (RIE) or Magnetic—Enhanced Reactive Ion Etch (MERIE)) is typically employed to remove the opaque layer 301b (and ARC 301c) as shown in FIG. 3e which exposes the transparent layer 301a. During these dry etch processes a gas is broken down into smaller reactive radicals (such as Fluorine or Chlorine) which adsorb into the exposed surface layer (e.g., opaque layer 301b), chemically react with and then remove surface layer atoms. This adsorption, reaction and removal activity is commonly referred to as reactive ion etching (RIE). Other techniques, such as magnetron, inductively coupled plasma, neutral loop discharge, electron cyclotron resonance, helicon, or helical resonator may also be employed.

Figure 3F:
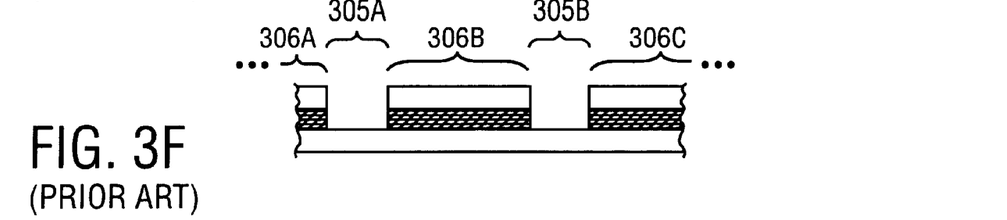
FIG. 3f shows the material of FIG. 3e after the resist is removed.

The completed mask, having transparent regions (e.g., 305a,b) and opaque regions (e.g., 306a,b,c) is formed once the resist layer 302 is removed as shown in FIG. 3f.

Refer back to FIG. 1 which shows a top view of a typical completed mask 100 (that is, a mask at the stage corresponding to FIG. 3f). Note that, typically, inactive area 102 may correspond to an opaque area, while alignment features 103a,b,c,d may correspond to transparent areas. The active device area 101, having the complex features associated with a semiconductor chip, typically has many small, complicated opaque and transparent regions in close proximity together.

There are typically two types of active device areas 101 used for characterizing masks: clearfield and darkfield. Clearfields are masks having the majority of opaque material removed after processing. Darkfields are masks having the majority of opaque material remaining on the mask after processing.

Because inactive area 102 may be mostly opaque, the active device area 101 is surrounded by a region of (typically) chrome that is not etched during the mask manufacturing process. Thus, referring to FIG. 1 and FIG. 3, the inactive area 102 may have a layer of resist 302 over it through most of the manufacturing process before the final etch step of FIG. 3f. A theory that correlates the loss of critical dimension control at the die area edge (e.g., as shown in FIG. 2a) with the presence of large amounts of resist 302 in the area surrounding the active device area 101 concerns resist loading.

Resist loading is the local dependence of etch rates on resist patterning density. Possibly, referring back to FIGS. 3e and 3f, CD control may be a function of the etching of the resist layer 302. For example, the resist layer 302 may consume plasma species which affects CD control.

As such, the amount of resist 302 that is available to consume plasma species within and proximate to a local region is a factor in the etch rates that occur at that local region. Local regions having more resist will have slower resist etching rates since relatively more plasma species are consumed. Referring to FIG. 1, modulating the amount of available resist within and/or proximate to the active device area edges 104 may therefore be employed to control the etching activity near the active device area edges 104 and prevent the aforementioned CD variation. One solution to the problem involves introducing some form of transparency to the inactive area 102 in the completed mask in order to reduce the amount of resist.

This may be accomplished by designing into the mask a pattern that corresponds to an area of exposed opaque layer material 301b in the inactive region 102 during the opaque layer etch step. This exposed area of opaque layer material corresponds to a transparent region in the inactive region 102 after the mask manufacturing process is completed. The formation of a transparent region results in a moat-like structure (hence the name given to this structure, the moat) that surrounds the active device area 101.

Figure 4:
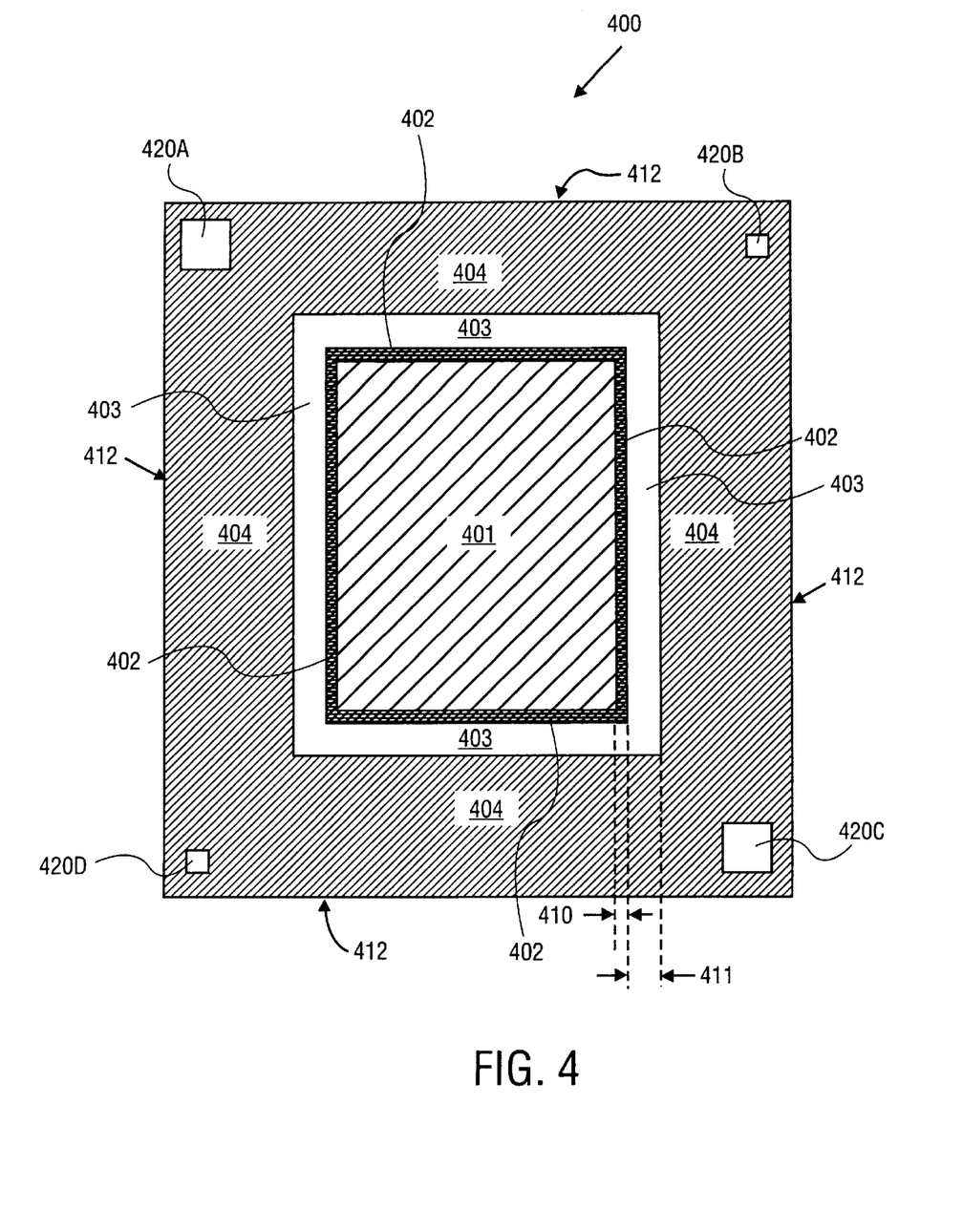
FIG. 4 shows a mask having a transparent moat.

An embodiment of such a mask design is shown in FIG. 4. FIG. 4 shows an active device area 401, an opaque alignment frame 402, a transparent moat 403 and the remaining inactive region 404. Again, this particular embodiment addresses a positive resist mask making process.

The opaque alignment frame 402 is used to align the optical exposure tool during the manufacture of the semiconductor device. Since the opaque alignment frame 402 introduces undesired resist at the active device area 401 edge, the opaque alignment frame width 410 should be reduced to a minimal width needed to properly align the manufacturing equipment. Wider widths are acceptable, however, provided critical dimension control is maintained.

Opaque alignment frame width 410 may also vary according to the various equipment intended to be used with the mask (if the various equipment have different minimum frame width 410 tolerances). The opaque frame width 410 is also typically uniform around the active device area 401 edge. However, different equipment may deviate from a uniform frame width in order to maximize alignment accuracy.

The embodiment of FIG. 4 shows the opaque alignment frame 402 immediately surrounding the active device area 401. However, other embodiments depending on the equipment employed may insert the opaque alignment frame 402 within the transparent moat 403 as well. This may be desirable since it removes the resist layer material further away from the active device area 401 edge. Again, the amount of distance depends upon the specific alignment frame requirements and/or alignment capabilities of the particular equipment using the mask.

The dimensions of the moat 403 are discussed next. In this embodiment, the moat 403 is transparent in the completed mask. Thus moat 403 corresponds to a region of exposed opaque material during the opaque material etch step. The moat width 411 is generally a function of two constraints: plasma specie diffusional length and mask manufacturing tolerances. By keeping the resist layer material to an inactive region 404 placed beyond a plasma specie diffusion length, its effect on the plasma specie density near the active device area 401 edges should be minimized. This sets a lower bound on the moat width.

Plasma based etches (such as RIE based etches) involve a complicated combination of various product species, intermediate species and reactant species within the plasma. To first order, the diffusion length of a specie is closely related to the specie's mean free path. Thus, for one chrome etch embodiment having 50 mTorr pressure and 25 C. temperature, the mean free path for an oxygen radical is 9.5 mm, while for a chlorine radical it is 3.5 mm, according to the following equation:

$$\lambda = \frac{1}{\sqrt{2}\,\pi d_o^2 n} \qquad \text{Eqn. 1}$$

In Equation 1, $d_O$ is the effective diameter of the specie (such as 0.120 nm for an oxygen radical) and n is the density. The density is dictated by the process temperature and pressure. The specie dictates the cross-section for collisional interactions and is related to the effective diameter.

As mentioned above, plasma based etches (such as RIE based etches) involve a complicated combination of various product species, intermediate species and reactant species within the plasma. High density plasmas, as is known in the art, have higher concentrations of species within the plasma. The various species are single atoms and molecules formed with atoms from elements such as Oxygen (O), Chlorine (Cl), Flourine (F) and Hydrogen (H). These molecules and single atoms may be ionic or electrostatically neutral.

The elements listed above are a list of typical elements found within plasmas. However, it is important to note that typical plasmas have other atoms (such as Chromium (Cr)) in lieu of or in combination with O, Cl, F and H. The presence of these other elements increases the complexity (i.e., number of possible specie combinations) within the plasma since they typically can form molecules with O, Cl, F and H alone or with various combinations of O, Cl, F and H. For example, different molecules based upon CrO, CrCl, or $CrO_2Cl_2$ are all possible within a plasma.

Furthermore, many of the above elements may exist within the plasma by themselves as a single atom (such as an H atom) or as a molecule such as $O_2$ or $Cl_2$. Again, these may be ionic or electrostaticaly neutral. Thus, the number of possible molecules or single atoms within a plasma that stem from each of the elements present in the plasma is very large.

Each type of molecule or single atom within a plasma corresponds to a specie within the plasma. Since the minimum bound of the moat width 411 is related to plasma specie diffusional length and without full knowledge of all the reactant species that exist in the plasma used to etch our mask (as is typical in the art), we have relied on empirical data to determine moat width 411.

Based on our empirical data, we have found that for a 50 mT plasma, a moat width of 10 mm was sufficient to deliver the desired CD improvement on a clearfield mask. As our plasma contains oxygen (which by itself has a reactant length of 9.5 mm as discussed above), note that our moat width 411 is comparable to the diffusional length of oxygen.

It is therefore possible that oxygen or oxygen based molecules are a dominant specie within our plasma and/or represent the specie(s) having the longest diffusional length. Dominant species are those species whose density within a plasma are most affected by resist loading. For example, dominant species may be those species that favor reactions with the resist as compared to other species. The presence of resist lowers the proximate density of oxygen.

Thus, moving the moat width 411 beyond the one or more dominant species' diffusional length(s) should noticeably reduce CD variation. Since oxygen reacts heavily with available resists, we believe that oxygen and/or molecules based upon oxygen may be a dominant species within our plasma.

An alternate theory concerns the fact that oxygen may have one of the longer diffusional lengths of the specie types. For example, recall that oxygen's diffusional length (9.5 mm) is nearly three times the diffusional length of a monotonic chlorine specie (3.5 mm). Our moat width of 10.0 mm may therefore represent a distance greater than the specie having the longest diffusional length. Alternatively, combining the two above perspectives, oxygen may represent the longest, dominant specie within our plasma. Thus, in such a case, our moat width 411 of 10.0 mm is greater than the longest, dominant specie within our plasma.

The 10.0 mm moat width 411 of our embodiment may also represent a weighted diffusional length of the entire plasma. For example, if the diffusional length of each specie (where each diffusional length has a coefficient related to the dominance of its corresponding specie) is summed over all the species within the plasma, an effective diffusional length of the entire plasma is produced. Given oxygen's strong reaction with available resists, we would anticipate the oxygen term(s) to dominate such an effective diffusional length expression.

Figure 5:
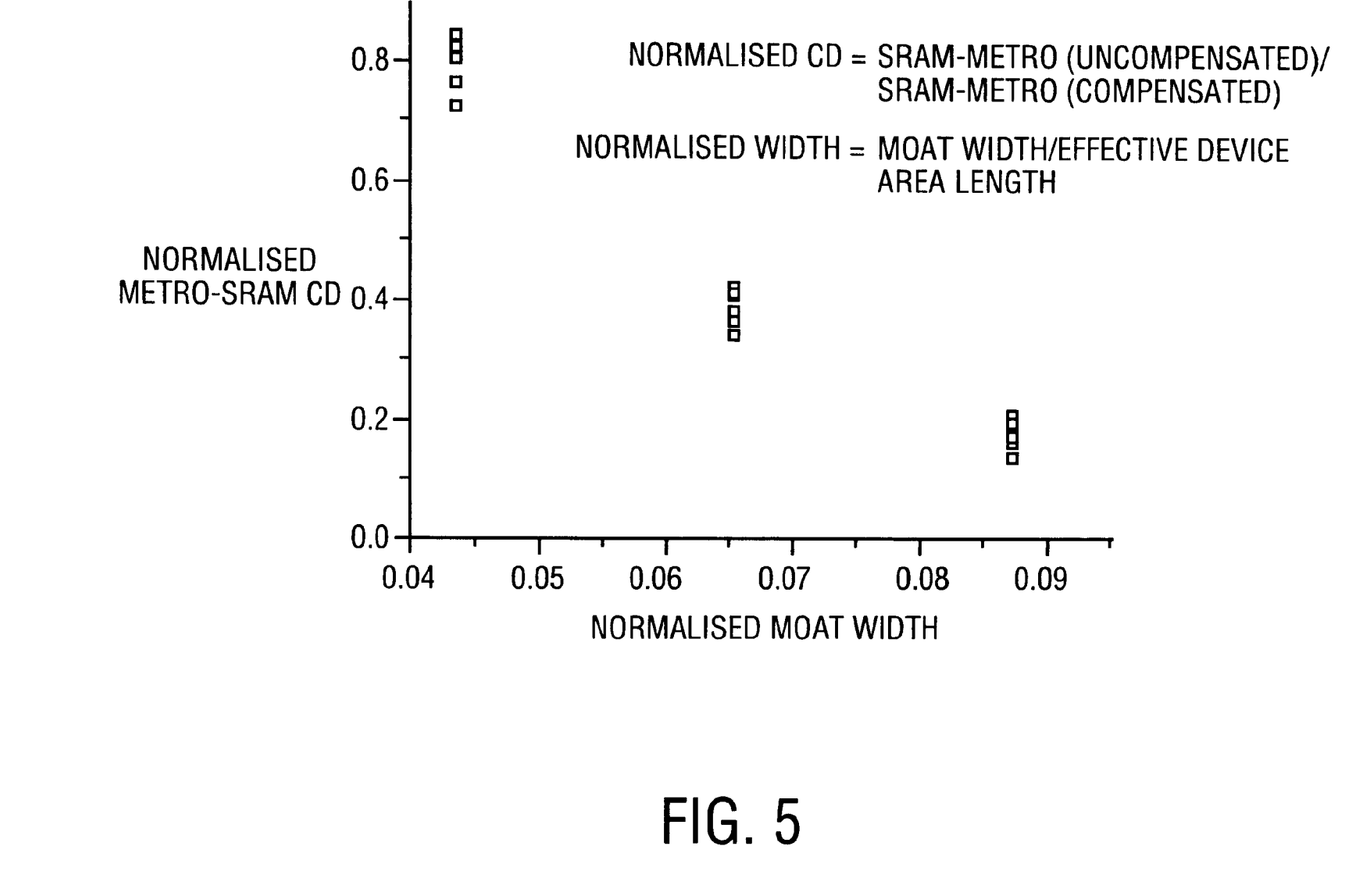
FIG. 5 shows an example of critical dimension control as a function of moat width.
Figure 6:
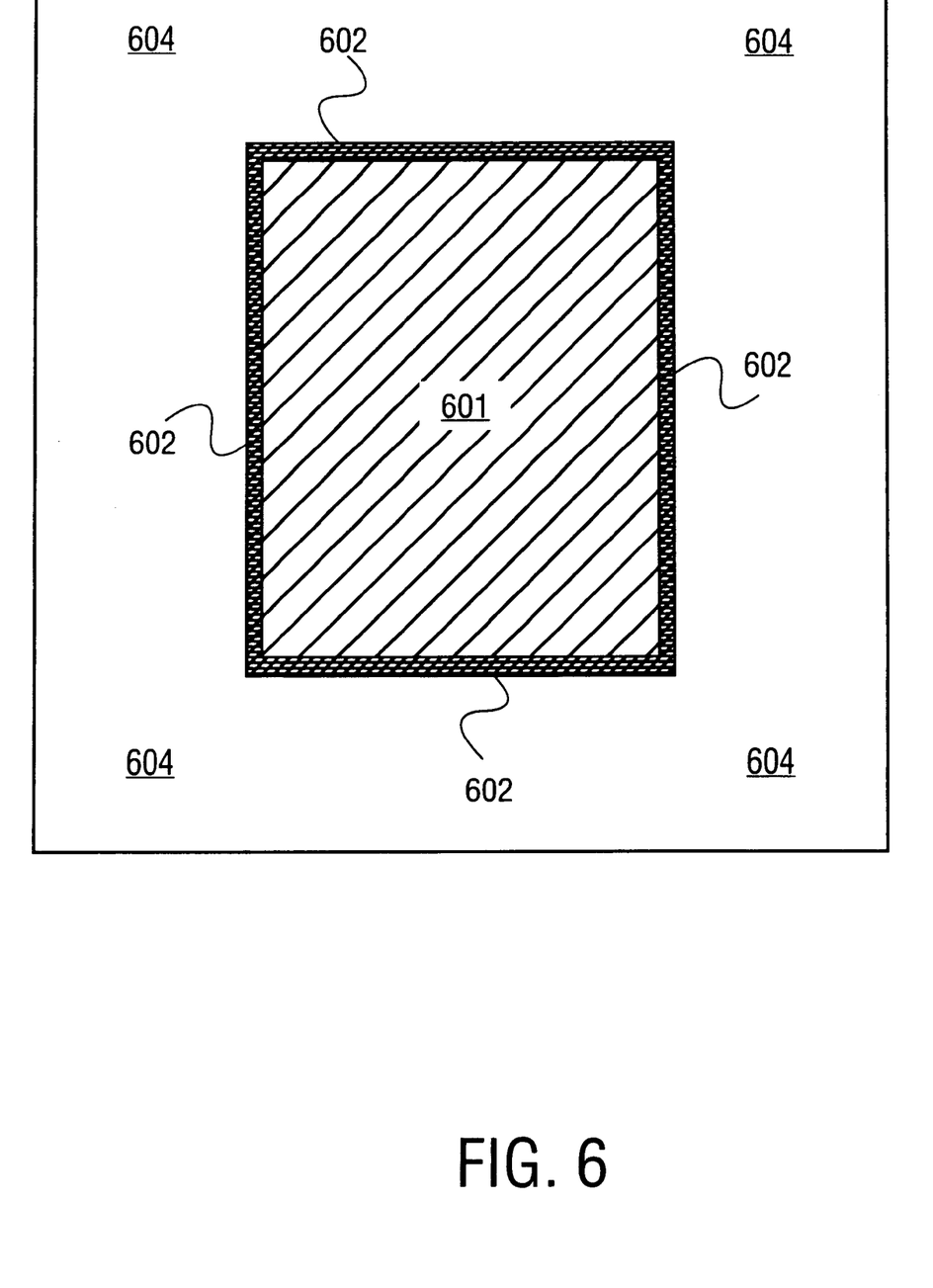
FIG. 6 shows a mask embodiment having a transparent inactive area.

The above discussion has related to the minimum bound on the moat width 411. The following discussion relates to the maximum bound on the moat width 411. FIG. 5 shows the observed relationship between the variation in metro cell critical dimension, normalized to a reference value, as a function of the normalized moat width 411. Since critical dimension variation drops with increasing moat width, the transparent moat width 411 could in principle extend (ultimately) to the mask edge 412 itself. Such an approach is shown in FIG. 6. FIG. 6 shows an active device area 601 surrounded by an alignment frame 602. The inactive area 604 is transparent.

In many applications, the maximum distance of the moat width 411 may be constrained by manufacturing issues. There are generally three constraints that limit the maximum extent of the moat width 411. First of all, there are features in the inactive area, such as alignment marks 420a–d, that should typically not be covered by the moat 403. Second, a larger moat width 411 increases the amount of opaque layer to clear during the etch step, leading to a longer required etch time and more resist loss than necessary. Greater resist loss generally degrades etch profiles, CD range and OPC fidelity. Finally, the radiation exposure process is typically a slow, cumbersome and expensive step in mask manufacturing. Thus, in order to fabricate cost effective masks, the amount of exposure area used to create the moat 403 should be reduced where possible.

Thus one may use: 1) Equation 1 in light of a plasma specie's expected diffusional lengths and/or dominance, consistent with one or more of the theories discussed above; and 2) an empirical approach (e.g., varying moat widths about values calculated above) to obtain an optimum moat width 411.

The embodiment discussed so far has related to a positive resist mask making processes. In positive resist processes, the regions of resist that are written to are removed. Other embodiments relate to negative resist mask making processes in which the regions of written to resist remain. This alters the previously mentioned cost effectiveness constraints. For negative resists, the layout of FIG. 6 is most cost effective since no writing is required in the inactive area 604. This is because if the inactive area 604 is not written to, all the resist in inactive area 604 is removed. This leaves inactive area 604 as a region of exposed opaque layer material during the opaque layer etch. However the other moat width constraints still apply. For example, the inactive area mask features (e.g., alignment features similar to those in FIG. 4, 420a–d—not shown in FIG. 7) should be written to in the negative resist.

In addition, if the benefits of resist loading reduction are outweighed by the impact to the etch (e.g., the time to etch away the opaque layer is too long, leading to excessive resist loss), some areas of the negative resist must be exposed to the radiation source to reduce the area of opaque layer to be etched.

Figure 7:
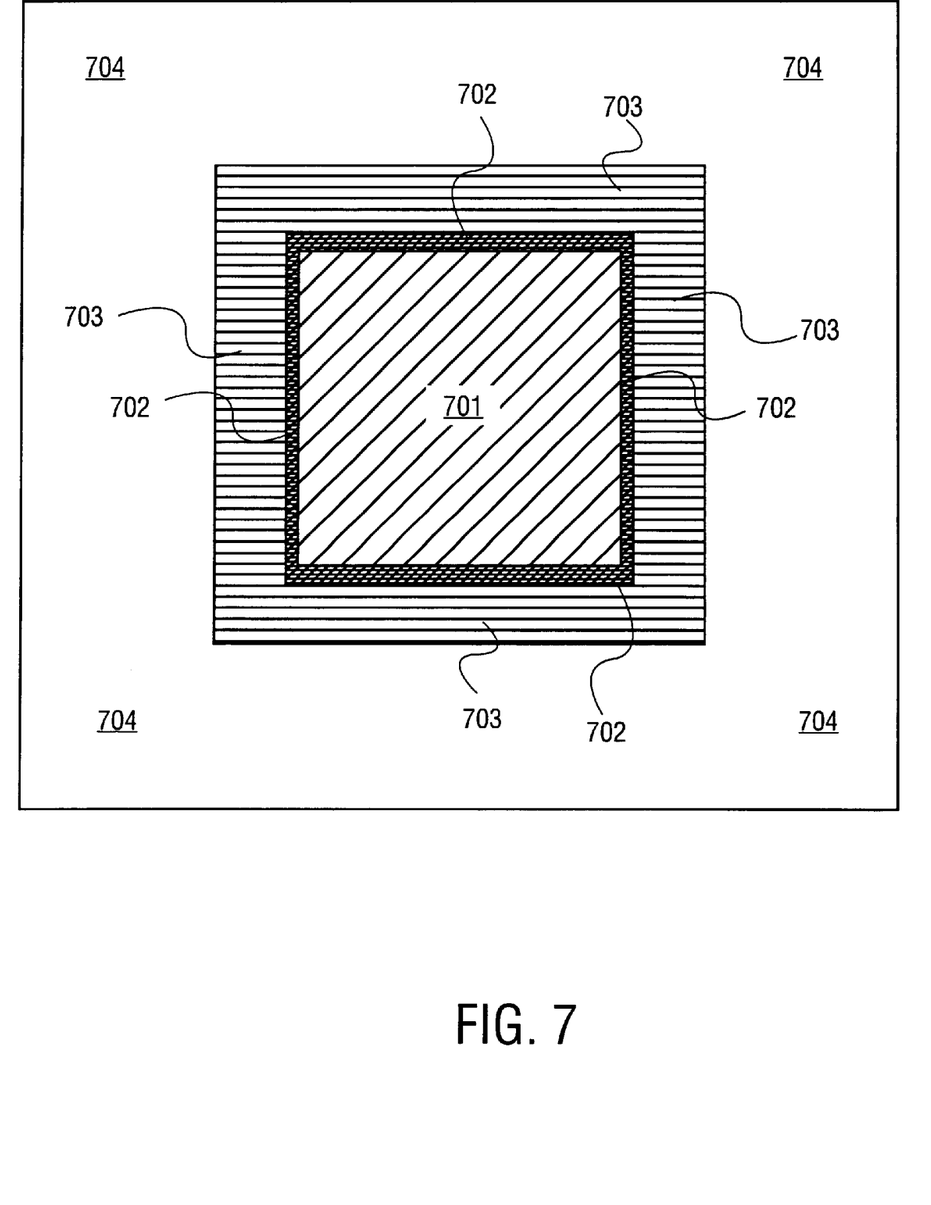
FIG. 7 shows a mask embodiment having an opaque moat.

FIG. 7 shows such an approach. In FIG. 7, moat region 703 was exposed to the radiation source. Since a negative resist is employed, the moat region 703 remains covered with resist after the resist removal step (e.g. step 3C to 3D in FIG. 3). This leaves region 704 as exposed opaque layer material during the opaque layer etch step. Region 704 is transparent when the mask is completed, while moat region 703 is opaque.

A tradeoff that arises with negative resist is exposure time vs. amount of opaque layer to etch at the mask periphery. It is more economical to expose away from the mask edge and closer to the active area. On the other hand, this opaque moat scheme potentially forces a tradeoff between resist loading and resist loss.

Other moat embodiments utilize semi-transparent moat regions. Semi-transparent moat regions attempt to modulate the etch rates at the active device area periphery by forming a micropatterned layer of resist resulting in a semi-transparent moat region.

Figure 8A:
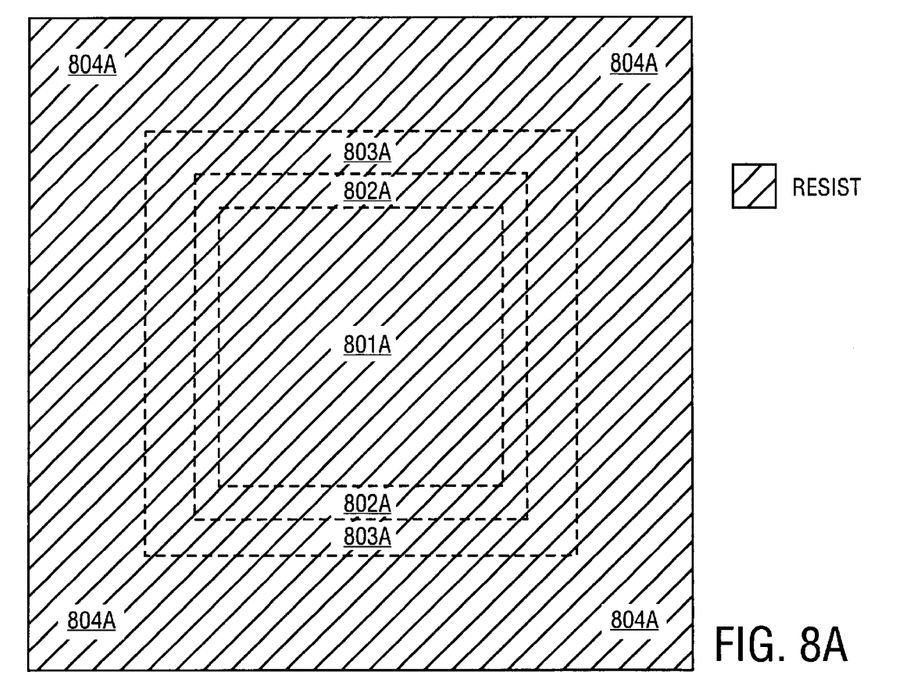
FIG. 8a shows a mask covered with resist.
Figure 8B:
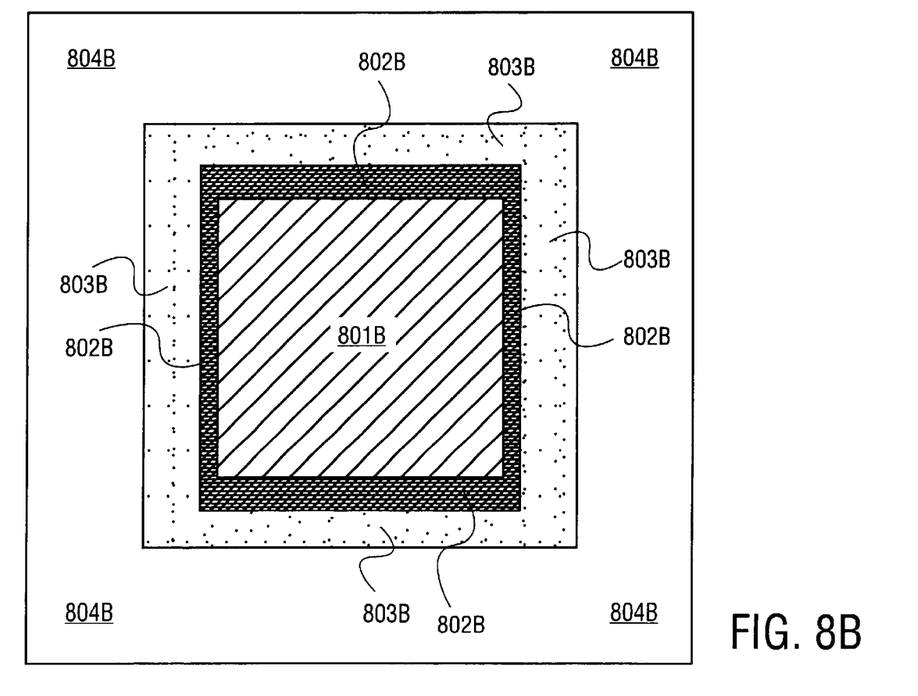
FIG. 8b shows a mask embodiment having a semi-transparent moat.

In FIG. 8a, the mask is covered with resist at the inactive area 803a, 804a. The mask is written to within a moat region 803a by the radiation source. However, the radiation source is configured such that only some of the resist within region 803a is written to. Thus, there exist regions of non-written to resist within regions 803a. After the resist etch step (e.g. from FIGS. 3C to 3D in FIG. 3), the region 803a will have a porous layer of resist. This corresponds to a micropatterned region of exposed opaque material which is used to consume reactants during the opaque layer removal step. Thus, as shown in FIG. 8b, when the mask is completed, the active device area 801b is surrounded by a semi-transparent moat region 803b having regions of opaque material mixed with transparent material at a subresolution scale. Note that distinctions between positive and negative resist are immaterial since either type of resist is partially written to.

What is claimed is:

1. An apparatus, comprising:
   a lithographic tool equipped with a mask in order to expose a wafer to patterned light, said mask comprising:
   a transparent layer that allows light to pass through said mask to said wafer;
   an opaque layer that thwarts the passing of light through said mask to said wafer;
   a range of metro cell edge slopes that help form a plurality of metro cells;
   an active device area, said active device area having a range of feature edge slopes, said plurality of metro cells used to help align said active device area within said photolithographic tool; and a region outside said active device area, said range of metro cell edge slopes at or within said range of feature edge slopes at least in part because said region sufficiently deterred etch rate reduction of a plasma etch used to form said metro cell edge slopes, said etch rate reduction caused by reactions between said plasma and a resist layer that existed on said mask outside said active device area during said plasma etch, said region exposing said opaque layer to said plasma during said plasma etch.

2. The apparatus of claim 1 wherein said resist layer was a negative resist layer.

3. The apparatus of claim 1 wherein said resist layer was a positive resist layer.

4. The apparatus of claim 1 wherein said region is a transparent moat that surrounds said active device area, said moat having a width, said width tailored to be greater than a diffusional length of a specie, said specie within said plasma.

5. The apparatus of claim 4 wherein said specie favors a reaction with said resist layer as compared to other species within said plasma.

6. The apparatus of claim 4 wherein said diffusional length is the longest diffusional length of those species within said plasma that react with said resist layer.

7. The apparatus of claim 4 wherein said diffusional length is an effective diffusional length for a plurality of species within said plasma that react with said resist layer.

8. The apparatus of claim 1 wherein said region is a transparent region that surrounds said active device area.

9. The apparatus of claim 1 wherein said region is a transparent region that surrounds an opaque moat, said opaque moat surrounding said active device area.

10. The apparatus of claim 1 wherein said region is a semi-transparent moat that surrounds said active device area.

* * * * *